United States Patent
Schlecht et al.

(10) Patent No.: US 6,547,307 B2
(45) Date of Patent: Apr. 15, 2003

(54) WINDUP WINDOW SHADE WITH WARPING COMPENSATION

(75) Inventors: Werner P. Schlecht, Vaihingen/Enz (DE); Herbert Walter, Ebersbach (DE)

(73) Assignee: Bos GmbH & Co. KG, Ostfildern (DE)

( * ) Notice: Subject to any disclaimer, the term of this patent is extended or adjusted under 35 U.S.C. 154(b) by 0 days.

(21) Appl. No.: 09/989,465

(22) Filed: Nov. 21, 2001

(65) Prior Publication Data

US 2002/0060468 A1 May 23, 2002

(30) Foreign Application Priority Data

Nov. 22, 2000 (DE) .......................... 100 57 762

(51) Int. Cl.[7] .................................. B60J 3/00
(52) U.S. Cl. ................ 296/97.4; 296/97.8; 296/152; 160/265; 160/98; 160/370.22
(58) Field of Search ............... 296/97.4, 97.8, 296/97.7, 97.5, 97.11; 160/370.22, 310, 263, 264, 265, 298, 323.1

(56) References Cited

U.S. PATENT DOCUMENTS

| | | | | |
|---|---|---|---|---|
| 4,252,172 A | * | 2/1981 | Pommat et al. ............. 160/322 |
| 4,758,041 A | * | 7/1988 | Labeur ...................... 296/97.8 |
| 4,836,263 A | * | 6/1989 | Ament ...................... 296/97.8 |
| 4,869,542 A | * | 9/1989 | Lin ............................. 296/97.8 |
| 4,898,224 A | * | 2/1990 | Woodworth ................ 296/97.8 |
| 5,089,912 A | * | 2/1992 | Simin ....................... 296/97.4 |
| 5,133,585 A | * | 7/1992 | Hassan ..................... 296/97.5 |
| 5,201,563 A | * | 4/1993 | Liao ......................... 296/97.4 |
| 5,201,810 A | * | 4/1993 | Ojima et al. ................ 160/265 |
| 5,249,616 A | * | 10/1993 | Yen .............................. 160/98 |
| 5,404,926 A | * | 4/1995 | Ojima et al. ................ 296/97.4 |
| 5,515,898 A | * | 5/1996 | Alcocer ....................... 160/265 |
| 5,562,144 A | * | 10/1996 | Ming-Shun ................ 296/97.8 |
| 5,575,524 A | * | 11/1996 | Cronk ....................... 296/97.8 |
| 5,947,544 A | * | 9/1999 | Hubeshi ..................... 296/97.4 |
| 6,039,107 A | * | 3/2000 | Pittard ........................ 160/265 |
| 6,086,133 A | * | 7/2000 | Alonso ....................... 296/97.8 |
| 6,170,553 B1 | * | 1/2001 | Villarreal-Chavez ........ 160/127 |
| 6,189,948 B1 | * | 2/2001 | Lin ............................ 296/97.4 |
| 6,206,076 B1 | * | 3/2001 | Stawski ...................... 160/265 |
| 6,216,762 B1 | * | 4/2001 | Lin ....................... 160/370.22 |
| 6,427,751 B1 | * | 8/2002 | Schlecht et al. ........ 160/370.22 |
| 6,460,593 B1 | * | 10/2002 | Floyd .................... 160/370.22 |
| 2001/0017194 A1 | * | 8/2001 | Schlecht et al. ........ 160/370.22 |
| 2002/0033244 A1 | * | 3/2002 | Schlecht et al. ........ 160/370.22 |
| 2002/0033616 A1 | * | 3/2002 | Schlecht et al. ........... 296/97.4 |
| 2002/0059986 A1 | * | 5/2002 | Schlecht et al. ........... 296/97.8 |
| 2002/0059989 A1 | * | 5/2002 | Schlecht et al. ........ 160/370.22 |
| 2002/0060469 A1 | * | 5/2002 | Schlecht et al. ........... 296/97.4 |
| 2002/0060470 A1 | * | 5/2002 | Schlecht et al. ........... 296/97.4 |

FOREIGN PATENT DOCUMENTS

EP 0 775 605 5/1997

* cited by examiner

*Primary Examiner*—Kiran Patel
(74) *Attorney, Agent, or Firm*—Venable; Norman N. Kunitz (57) ABSTRACT

A windup window shade has a windup shaft and a window shade web fastened on it. The window shade web is provided with a traction rod, which is moved at both ends by means of drive members along the guide rails. A compensating device is provided to compensate assembly tolerances or shape tolerances, which assures that too great tensions extending parallel with the windup shaft do not occur in the window shade web, which would lead to obliquely extending waves in the extended window shade web.

17 Claims, 6 Drawing Sheets

WINDUP WINDOW SHADE WITH WARPING COMPENSATION

BACKGROUND OF THE INVENTION

Modern automobile body shapes are distinguished by relatively large window areas. Because of strong sunlight, the large window areas result in considerable heat generation in the interior of the vehicle and, in connection with vehicles with air conditioning, this extensive heat generation results in a not inconsiderable use of energy in order to counteract the heating effects on the vehicle.

For this reason, motor vehicles are increasingly equipped with windup window shades.

In this connection it is known to attach two guide rails laterally next to the window, in which the end of the traction rod of the window shade web is guided. The length of the traction rod is adjustable in order to be able to accommodate various window widths. Actuation takes place by means of the thrust members running in the guide rails.

The thrust members can only be sufficiently adjusted with a very large outlay, so that they move the traction rod of the window shade web exactly parallel to the windup shade. If there is a lack of parallelism, the window shade web is pulled obliquely, which results in waves extending obliquely in the extended window shade web. This does not look nice and is objected to.

Based on the foregoing it is the object of the invention to create a windup window shade for motor vehicles, wherein inexactly adjusted thrust members cannot cause warping of the window shade web.

SUMMARY OF THE INVENTION

In accordance with the invention, this object is attained by a windup window shade for regulating the entry of light through a window into the interior of a motor vehicle, in particular a rear window windup shade, having: at least one windup shaft that is rotatably seated; at least one window shade web that is fastened along one edge to the windup shaft, whose edge that is parallel with the one edge is connected with an associated traction rod, and which has lateral longitudinal edges, wherein, in the course of the extension of the window shade web, the traction rod has a nominal position with respect to the windup shaft which position is a function of the position of the window shade web, and in which no transverse tensions occur; at least one pair of guide means, each of which extends laterally beside the extended window shade web, and each of which contains at least a guide groove in which the ends of the traction rod are guided; a drive mechanism, which has first and second drive or thrust members that are arranged such that an effective end of the first drive member acts together with or on the one end of the traction rod, and the effective end of the second drive member acts together with or on the other end of the traction rod, and, a compensating device that at least reduces a displacement of the traction rod by the thrust or drive members out of the nominal position.

The displacement out of the nominal position essentially occurs because the drive members used for moving the traction rod have a distance from the windup shaft which is different from the nominally required effective distance. Another cause of skewed pulling of the window shade web is due to a traction rod which from the start does not extend in accordance with the nominal position and acts together with exactly adjusted drive members.

If, for example, the drive members operate as thrust members and are moved synchronously by an electric motor in the sense of taking the traction rod along for pulling the window shade web out, an uneven tension is created in the window shade web with the result of a wave formation, if the one thrust member precedes and thereby displaces the traction rod out of its natural position which, in case of a rear window, extends parallel with the window shade web, for example.

The problems inherent in the displacement of the traction rod and in adjustment are increased because the drive members act together interlockingly with the gear motor. Because of this, an offset up to almost one tooth spacing can occur between the two drive members, which in actual use amounts to approximately between 3 and 6 mm. Added to this is the tolerance with which the window shade web is produced. The traction rod can inherently show a parallelism error in relation to the windup shaft because of sewing and cutting tolerances.

If these tolerances overlap in a disadvantageous manner, errors of up to 10 mm and more are not impossible. Such an effective offset results in an oblique stress on the window shade web with the result of obliquely extending waves or folds in the window shade web.

Similar conditions also basically arise in connection with side windows. However, here the traction rod is in an oblique position in relation to the windup shaft anyway, i.e. in the nominal position the traction rod extends obliquely in respect to the windup shaft. If in this case the traction members act in an offset manner and forcibly change the natural position of the traction rod, wave formation will also result.

The compensating device in accordance with the invention automatically ensures that the displacement of the traction rod out of the respective nominal position (obliquely or parallel) occurs at least to a lesser extent and that no visible wave formation in the window shade web is caused.

Several basic solutions regarding the compensating device are possible in principle.

In accordance with one solution, the windup shaft of the window shade web is seated in a hoop, which itself can swing in a limited way around the transverse axis.

The axis is preferably located in the center in relation to the longitudinal extension of the windup shaft. Because of this, the windup shaft can adjust itself in such a way that the traction rod maintains the nominal position in relation to the windup shaft.

Instead of seating the windup shaft in a hoop, it is possible to achieve the same goal if the one end of the windup shaft is seated in a stationary bearing, which is limitedly pivotable, or makes an appropriate tilting play available for the windup shaft, while the windup shaft can move freely to a large extent in the other bearing in respect to a plane, which is parallel with the plane defined by the extended window shade web.

For compensating tolerance errors in both directions, the windup shaft has of course an opposite inclination in the position of rest.

The bearing, which is simultaneously used as the anchoring of the spring drive, is preferably stationary. In this case it is sufficient if an oblong hole is provided for the other bearing bore, in which a bearing journal is displaceably seated.

Finally, a further actual option for locating the compensating device consists in the arrangement of spring members between the drive members and the traction rod. Because of their resilience, the spring members reduce the force difference occurring at both ends of the traction rod and leading to wave formation.

The guide means of the window shade web of the invention preferably consist of guide rails in which guide grooves are contained.

The guide groves can be simultaneously used for guiding the thrust members secure from kinking.

The drive mechanism becomes particularly simple if the windup shaft is biased in the windup direction of the window shade web with the aid of a spring drive. In this case the windup shaft is forced to follow the movement of the window shade web as impressed on the traction rod by the electric motor and the drive members.

The window shade web can consist of a woven material or a perforated or dyed foil.

In connection with windows whose surfaces differ from the rectangular shape, the traction rod is length-adjustable in order to be able to follow the changing distance between the guide rails.

Further embodiments of the invention are inter alia subject of dependent claims. It is intended here that also those combinations of characteristics are considered to be claimed, for which there is no explicit exemplary embodiments.

BRIEF DESCRIPTION OF THE DRAWINGS

Exemplary embodiments of the subject of the invention are represented in the drawings. Shown are in.

DESCRIPTION OF THE PREFERRED EMBODIMENTS

Figure 1:
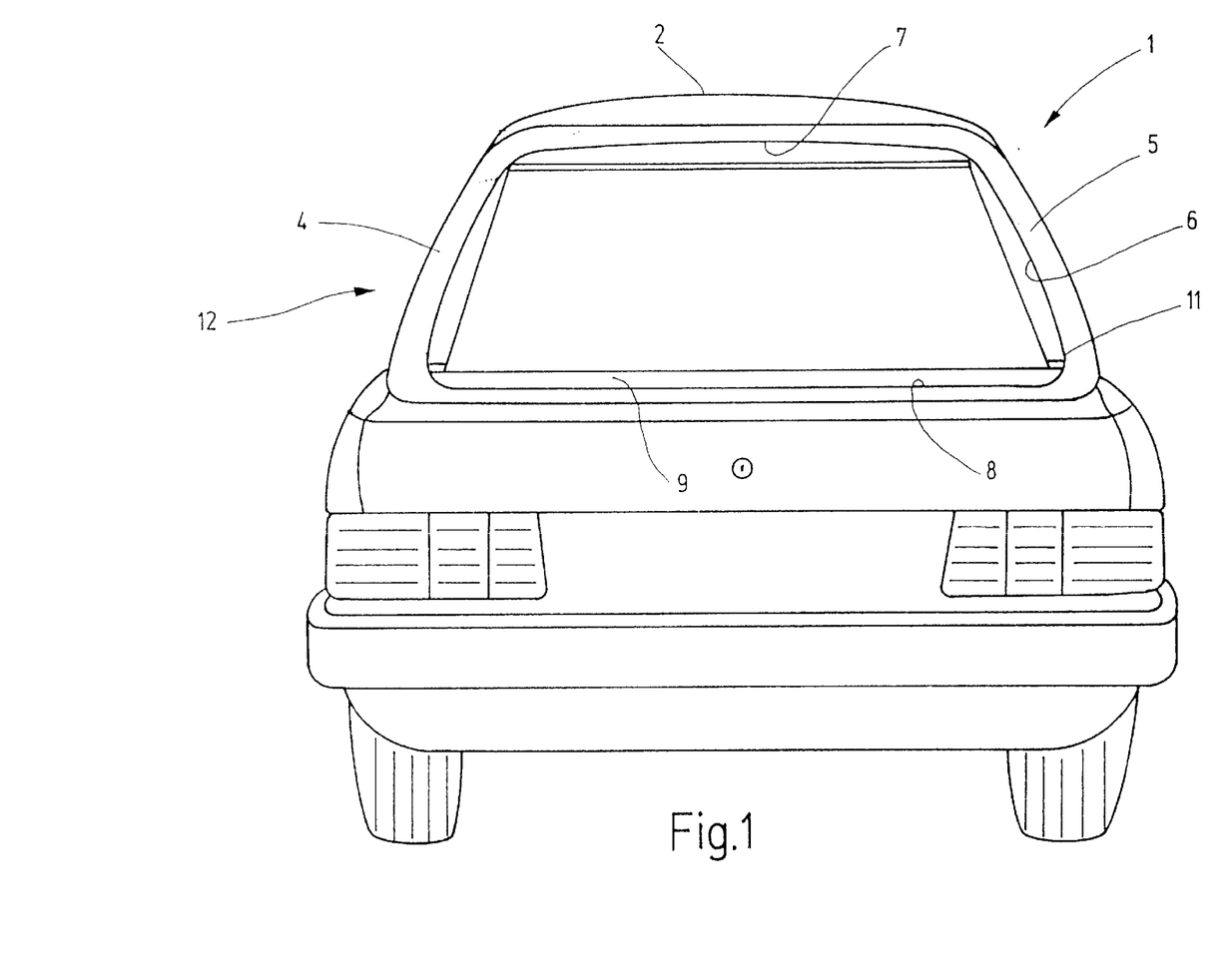
FIG. 1, a passenger car in a rear view, showing a rear window windup shade in accordance with the invention in the extended state, FIG. 2, the basic structure of the rear window windup shade in accordance with FIG. 1, FIG. 3, the guide rail of the rear window windup-shade in accordance with FIG. 1 in a cross-sectional view, FIG. 4, the seating of the windup shafts of the rear window windup shade in accordance with FIG. 1 in a simplified schematic representation, FIG. 5, the drive mechanism of the rear window windup shade in accordance with FIG. 1 in a simple schematic representation, FIG. 6, a further exemplary embodiment of the seating of the windup shaft for providing the compensating movement in a perspective representation, and FIG. 7, an exemplary embodiment of the compensating device in case of a stationarily seated windup shaft.

In a schematic representation, FIG. 1 shows a rear view of a passenger car 1, having a roof 2, a trunk 3, as well as two C-pillars 4 and 5. A rear window opening 6, which is bordered at the top by a rear edge 7 of the roof and on the bottom by a lower window edge 8, is located between the two C-pillars 4 and 5. A rear window pane is seated in the rear window opening 6 in a known manner, for example glued in by means of a window rubber strip.

A rear window shelf 9 is located in the interior of the passenger car 1 in front of the rear window, which horizontally extends between the lower window edge 8 and the backrest of a rear seat, not visible in the drawing. A straight outlet slit 11 extends in the rear window shelf 9.

Figures 2, 3:
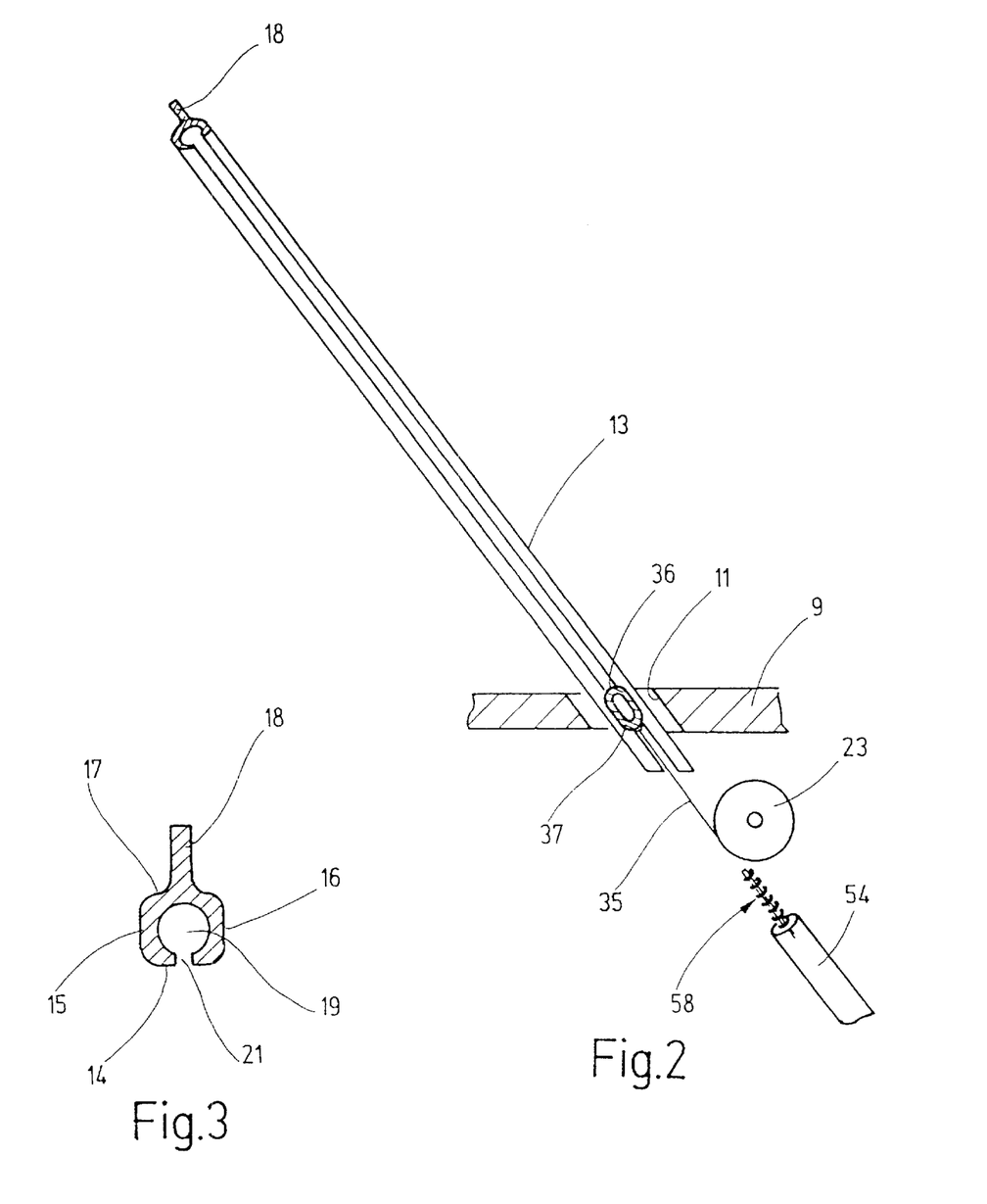

The outlet slit 11 is a part of a rear window windup shade 12, whose basic structure is shown, greatly schematized, in a lateral view in FIG. 2.

The rear window windup shade 12 has two guide rails, which are fastened next to the lateral edges of the rear window opening 6 on both C-pillars 4 and 5. Because of the cut-open basic representation, only one guide rail 13, which for example is fastened on the C-pillar 5, can be seen in FIG. 2.

The guide rail 13 has the cross-sectional profile represented in FIG. 3. It is essentially square in cross section with rounded corners and is bordered by a front 14, two lateral walls 15 and 16, as well as by a back 17. A strip-like fastening flange 18 extends from the back 17, with the aid of which the guide rail 13 is to be attached to appropriate parts of the vehicle body.

A guide groove 19, which is circular in cross section and open via a slit 21 toward the front 14, is contained in the guide rail 13.

The guide rail 13 is for example made of an extruded aluminum profile.

Since the slit 21 is narrower than the diameter of the circular section of the guide groove 19, an undercut groove is created, which is suitable for protecting a linearly shaped thrust member against kinking and, by means of an appropriate cross section, to prevent the thrust member of an appropriate diameter from passing through the slit 21 to the outside.

The guide rails 13 are bent in respect to several axes so that they follow the contour of the window edge without becoming visible in the window itself. The guide rails 13 are arranged in such a way that the grooves 19 open in the direction toward each other.

As FIG. 2 shows, the guide rails 13 extend downward through the slit 11 as far as below the rear window shelf 9.

Figure 4:
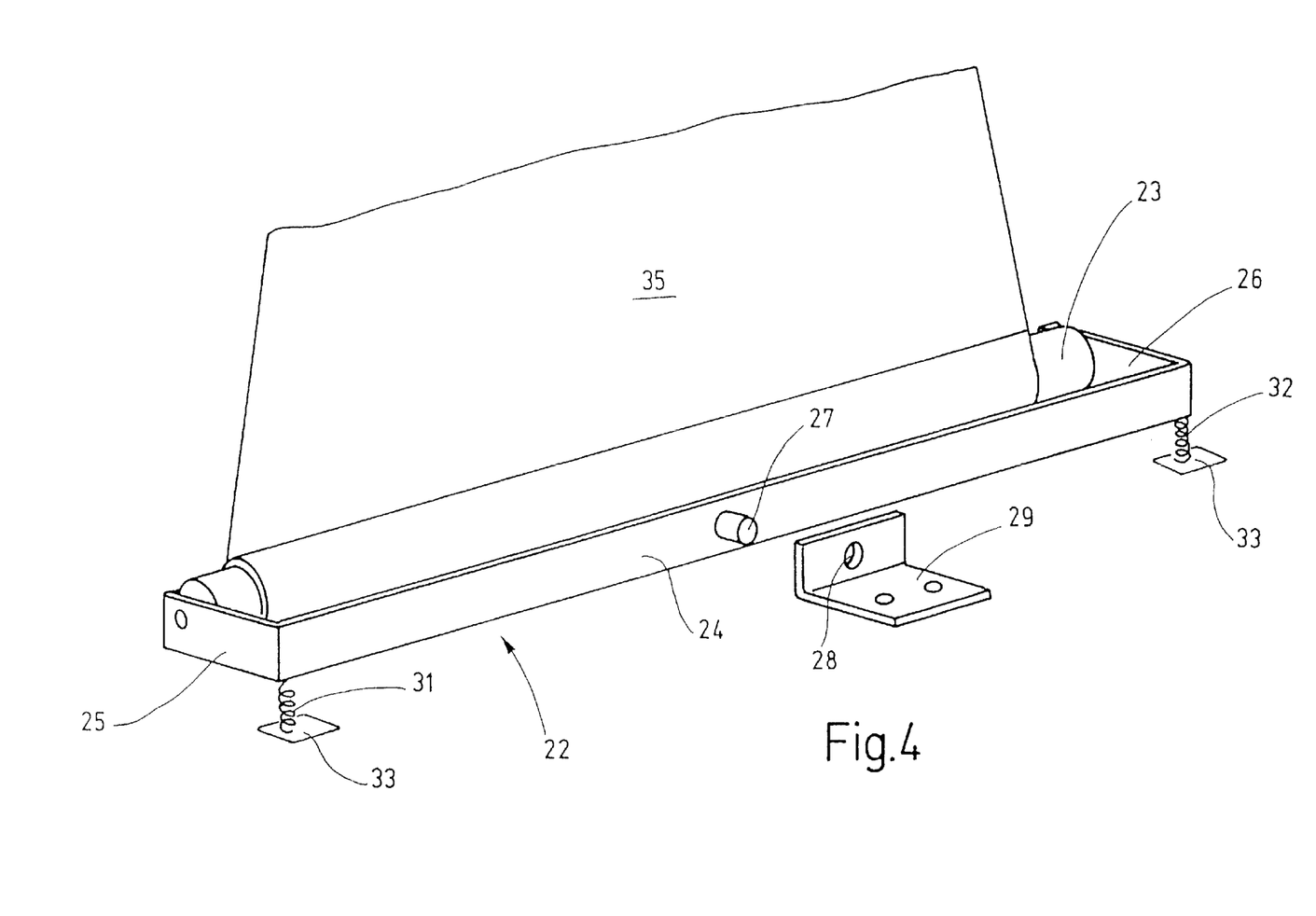

As indicated in FIG. 4, a windup shaft 23 is rotatably seated in a seating hoop 22 which is part of the desired compensating device.

The seating hoop 22 for seating the windup shaft 23 is a U-shaped structure, having a rear element 24 and two legs 25 and 26 extending at right angles therefrom, in which the windup shaft 23 is rotatably seated by means of appropriate bearing journals.

A bearing journal 27 is located in the center of the rear element 24, whose axis extends at right angles to the axis of the windup shaft 23. The bearing journal 27 is seated in a bearing bore 28 of a base holder, or bracket 29, which is fixedly anchored in the vehicle underneath the rear window shelf 9. In this way the windup shaft 23 can rotate, limited in respect to the axis defined by the bearing journal 27.

The middle position, i.e. the centered position, is defined by two compression springs 31 and 32, one end of which is supported on the seating hoop 22, and the other on a rest 33, which is fixed in place on the vehicle body and is schematically indicated. The two springs 31 and 32 are seated on the transition point of the rear element 24 into the respective legs 25 or 26, so that equal torques are generated.

Figure 5:
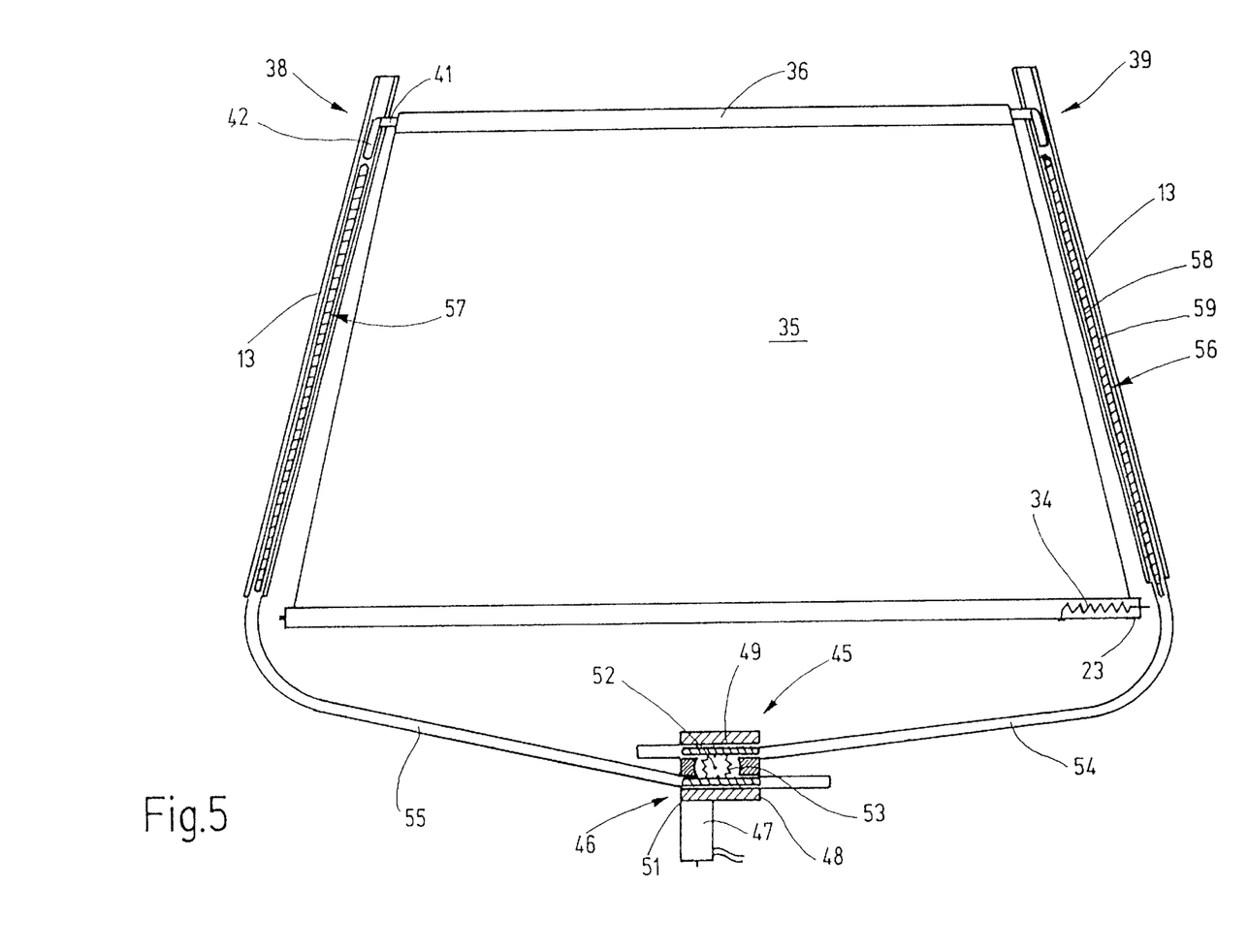

The windup shaft 23 is tube-shaped and houses a spring drive 34 (See FIG. 5). The spring drive 34 consists of a helical spring, one end of which is fixed in place in the interior of the windup shaft 23 and the other end is anchored on the seating hoop 22.

A window shade web 35, whose shape is a trapeze-like approximation of the contour of the rear window 6, is fastened with one edge on the windup shaft 23. The edge remote from the windup shaft 23 is formed into a hose-shaped loop 36, in which a traction rod 37 is seated. The traction rod 37 consists of a dimensionally stable tube, into which two L-shaped guide members 38 and 39 have been inserted from both ends, as represented in FIG. 5.

The guide member 38 consists of a long leg 41, which can be displaced in the dimensionally stable tube, and of a leg 42 which is angled off in an L-shape. The leg 41 is matched to the cross section of the dimensionally stable tube and its dimensions are such that it can reach through the slit 21 into the interior of the respective guide groove 19. But the leg 42 is matched to the cross section of the circular part of the guide grove 19. In this way the leg 41 can be longitudinally displaced in the dimensionally stable tube, and the leg 42 can move along the respective guide groove 19. It cannot be pulled laterally out of the slit 21.

The guide member 39 has the same structure as the guide member 38, so that another explanation can be omitted.

A drive mechanism 45, which is represented in a greatly schematized manner in FIG. 5, is provided for extending the window shade web 35. To simplify the representation and to make the understanding of the invention easier, the two lateral guide rails 13 are represented rotated in section in FIG. 5 in such a way that the two guide grooves 19 point toward the viewer. As stated, this illustration is merely provided for making understanding easier. In actuality the two guide grooves 19 open in the direction toward each other and not in the direction toward the viewer.

A gear motor 46 is a part of the drive mechanism 45, which is composed of a permanently excited d.c. motor 47 and a gear housing 48. Two guide channels 49 and 51 are contained parallel to each other in the gear housing, between which an output gear wheel 53 is provided on an output shaft 52. The output gear wheel 53 can be selectively put into motion in both directions of rotation by means of the output shaft 52, which is connected with it, fixed against relative rotation.

A gear motor 46 is a part of the drive mechanist 45, which is composed of a permanently excited d.c. motor 47 and a gear housing 48. Two guide channels 49 and 51 are contained parallel to each other in the gear housing between which an output gear wheel 55 is provided on an output shaft 52. The output gear wheel 53 can be selectively put into motion in both directions of rotation by means of the output shaft 52, which is connected with it, fixed against relative rotation.

A flectionally elastic, linearly-shaped thrust member 56, or 57, extends through the guide channel 49, as well as through the guide channel 51. The respectively unused portion of the thrust members 56, 57 is pushed back into reservoir tubes, which extend from the respectively other end of the guide channels 49, 51.

The two thrust members 56 and 57 are identically constructed. Each consists of an elastically flexible core 58, which has one or several teeth or ribs 59 on its exterior, which form a single- or multi-start screw thread there. The ribs 59 protrude radially and run helically over the cylindrical core 58 from one end of the thrust member to the other end. The output gear wheel 53 has teeth which can enter between the grooves formed by the ribs 59. In this way the output gear wheel 72 is interlockingly coupled with the thrust members 56 and 57.

The mode of functioning of the described rear window windup shade is as follows:

In the position of rest, the windup shaft 23 has been rotated by the action of the spring drive 34 into a position in which the window shade web 35 is wound up. In this position the hose-like loop 36 is located in the outlet slit 11, as can be seen in FIG. 2. The guide members 38, 39 are located in the vicinity of the lower ends of the two guide rails 13, but without the legs 42 having been released out of the associated guide grooves 19 and 21.

At the same time the two ends of the thrust members 56 and 57 are spaced apart from the respective legs 42.

If, starting from this position of the rear windup window shade 12, in which the entry of light into the vehicle interior is not hampered at all, the user would like to create a shading effect, he would extend the window shade web 35. The window shade web 35 reduces the entry of light, but without stopping it completely. For this purpose the window shade web 35 is made, for example, of an open chain weave, or a perforated plastic foil, which is colored black.

To extend the window shade web 35, the gear motor 46 is put into operation in a direction of rotation in which it moves the thrust member 56 toward the right through the guide groove 19. Since the two thrust members 56 and 57 mesh with the output gear wheel 53 at diametrically opposite ends, the thrust member 57 is simultaneously pushed forward toward the left through the guide groove 19 of the left guide rail 13. After a short distance over the advance path, the free ends of the two thrust members 56 and 57 come into engagement with the lower ends of the legs 42 of the two guide members 38 and 39, and in the further process push the guide members 38 and 39 in the direction toward the upper end of the two guide rails 13.

Since the distance between the guide rails changes, the legs 41 of the guide members 38 and 39 simultaneously dip telescope-like into the dimensionally stable tube of the traction rod 37 contained in the respective loop 36.

As soon as the end position has been reached, the gear motor 46 is stopped. The extended end position is represented in FIG. 5.

The gear motor 46 is self-locking and arrests the thrust members 56 and 57 in their respectively reached positions.

The switch-off of the gear motor 46 is performed with the aid of limit stop switches, or in that the guide members 38 and 39 run up against stops, so that a blocking current occurs, which is evaluated in an electronic device and leads to switch-off.

The window shade web 35 is now held stretched between the traction rod 37 and the windup shaft 23.

For retraction, the gear motor 46 is started in the opposite direction of rotation, so that the two thrust members 56 and 57 are moved downward out of the associated guide rails 13. The traction rod 37 simultaneously moves downward, because the window shade web 35 is constantly kept under tension by the action of the spring drive 34 of the windup shaft 23.

Because of the construction of the windup window shade 12, the traction rod 37 has a structurally dictated nominal position (angular position) in respect to the windup shaft 23. All tensile stresses in the window shade web 35 are aligned at right angles, regardless of how much of the window shade web 35 has been drawn off the windup shaft 23. In the case of the rear windup window shade represented, the structurally dictated nominal position is a position in which the traction rod 37 lies parallel with the windup shaft 23.

The shape of the window shade web 35 and the position of the thrust members 56, 57 are aligned with this structurally dictated nominal position.

Because of tolerances in the shape, the structurally dictated nominal position is not attained, instead only an actual nominal position. Assembly tolerances of the thrust members 56, 57 lead to the thrust members 56, 57 not moving in accordance with the structurally dictated nominal position in respect to windup shaft 23; one thrust member will always run ahead of the other. The combined effect of the shape tolerance and the assembly tolerance results in a more or less extensive displacement of the traction rod 37 from the natural position. The window shade web counteracts this displacement so that, without taking countermeasures, tensions are induced in the window shade web 35, which extend obliquely in respect to the longitudinal axis of the windup shaft 23, because the thrust members 56, 57 tend to push the traction rod 37 out of its natural position into a forced position.

However, since the windup shaft 23 is pivotably seated with the aid of the seating hoop 22, the windup shaft 23 can be aligned obliquely to a limited extent, and therefore in accordance with the actual position of the traction rod 37 into which the traction rod 37 had been forced by the thrust member 56, 57. Transversely extending tension components in the window shade web 35 are not possible. The effects being generated because the position of the traction rod 37 does not correspond with the nominal position in accordance with the shape are at least reduced.

The loop 22 is biased in the centered position with the aid of the two springs 31 and 32. Tumbling around the transverse axis, and therefore clattering during the drive is prevented.

Figure 6:
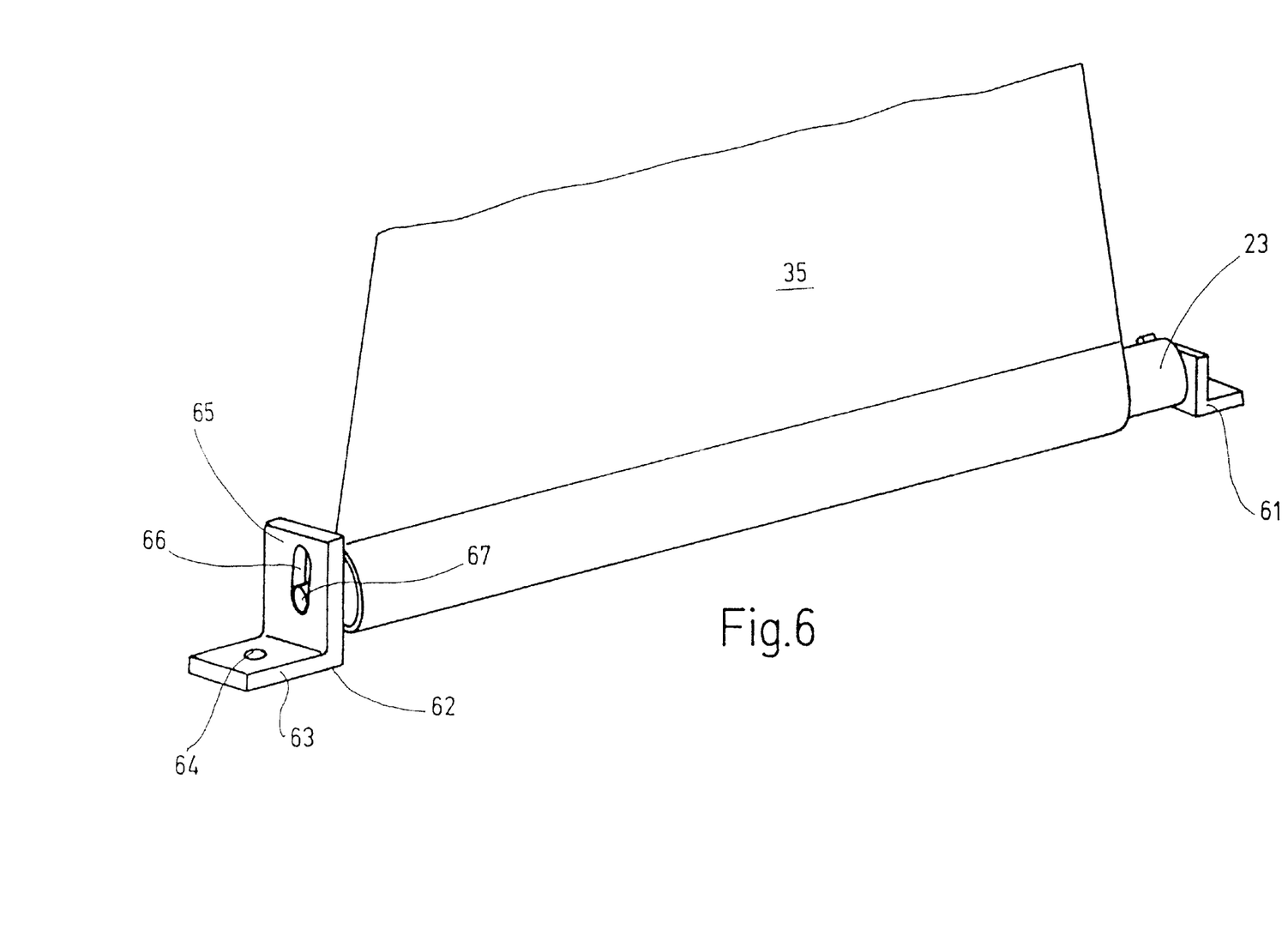

A further option of reducing or compensating tensile stresses created because the thrust members 56, 57 rotate the traction rod 37 out of its natural position or tilt it, is represented in FIG. 6.

Instead of using a hoop 22 in which the windup shaft 23 is seated as the compensating device, as represented in FIG. 4, in the exemplary embodiment in accordance with FIG. 6 the windup shaft 23 is stationary seated with its right end, as seen in the representation, in a stationary bearing block 61. The stationary end of the spring drive 34 is also supported there. However, the bearing journal, not visible in FIG. 6, has a certain amount of tilt play in respect to the windup shaft 23.

Another bearing block 62, fixed in place on the vehicle body, is located on the opposite end and is fastened, for example with its leg 63 and an appropriate fastening bore 64, on a bearing structure of the vehicle. A further leg 65 of the bearing block 62 is located in a plane on which the windup shaft 23 extends perpendicularly. An oblong hole 66 is contained in this leg 65, which receives a corresponding bearing journal 67 of the windup shaft 23 in a rotatable manner. The long axis of the oblong hole 66 extends in a direction approximately parallel with a plane which is defined by the extended window shade web 35.

The bearing journal 67 can move quite freely from the position represented in the drawing figure, in which it adjoins the leg 63, into the other end position in the oblong hole 66. To make the movement;possible, the other end of the windup shaft is correspondingly tiltably movable in the bearing block 61.

In the position of rest as represented in FIG. 6, the windup shaft lies in the end of the oblong hole corresponding to the least favorable tolerance pairing between the shape tolerance and the assembly tolerance, so that with this unfavorable pairing the thrust member, for example the thrust member 57, in any case first comes into contact with the guide member 38 which directly adjoins the oblong hole 66, or the bearing block 62.

The windup shaft 23 can be slightly canted because of the guidance in the oblong hole 66 and the quite stationary seating at the other end in the bearing block 61, and can in this way adapt itself to the position of the traction rod 37, which is forced on the traction rod 37 because of the action of the two thrust members 56 and 57.

The farther the thrust member 57 moves ahead of the thrust member 56 in the exemplary embodiment represented, the more the bearing journal 67 is lifted in the oblong hole 66 (again in relation to FIG. 6). Transversely extending tension because of an asymmetric extension of the traction rod 37 is avoided to a large extent.

In the previously explained exemplary embodiments, the windup shaft 23 was respectively limitedly pivotable around a transverse axis. In the case in accordance with the exemplary embodiment of FIG. 4, the transverse axis is located approximately in the center of the longitudinal extension of the windup shaft 23, while in the embodiment in accordance with FIG. 6 it extends through one of the bearing journals at the end of the windup shaft 23.

However, it is also possible to provide the required tolerance compensation with a stationary seated windup shaft. A solution of a further compensating device as represented in FIG. 7, for example, can be used for this.

A transverse pull is generated in the window shade web 35 if the forces generated by the two thrust members 56 and 57 at the sides of the window shade web 35 differ too greatly from each other. Spring members 71 are provided in accordance with FIG. 7 to eliminate this great difference.

Figure 7:
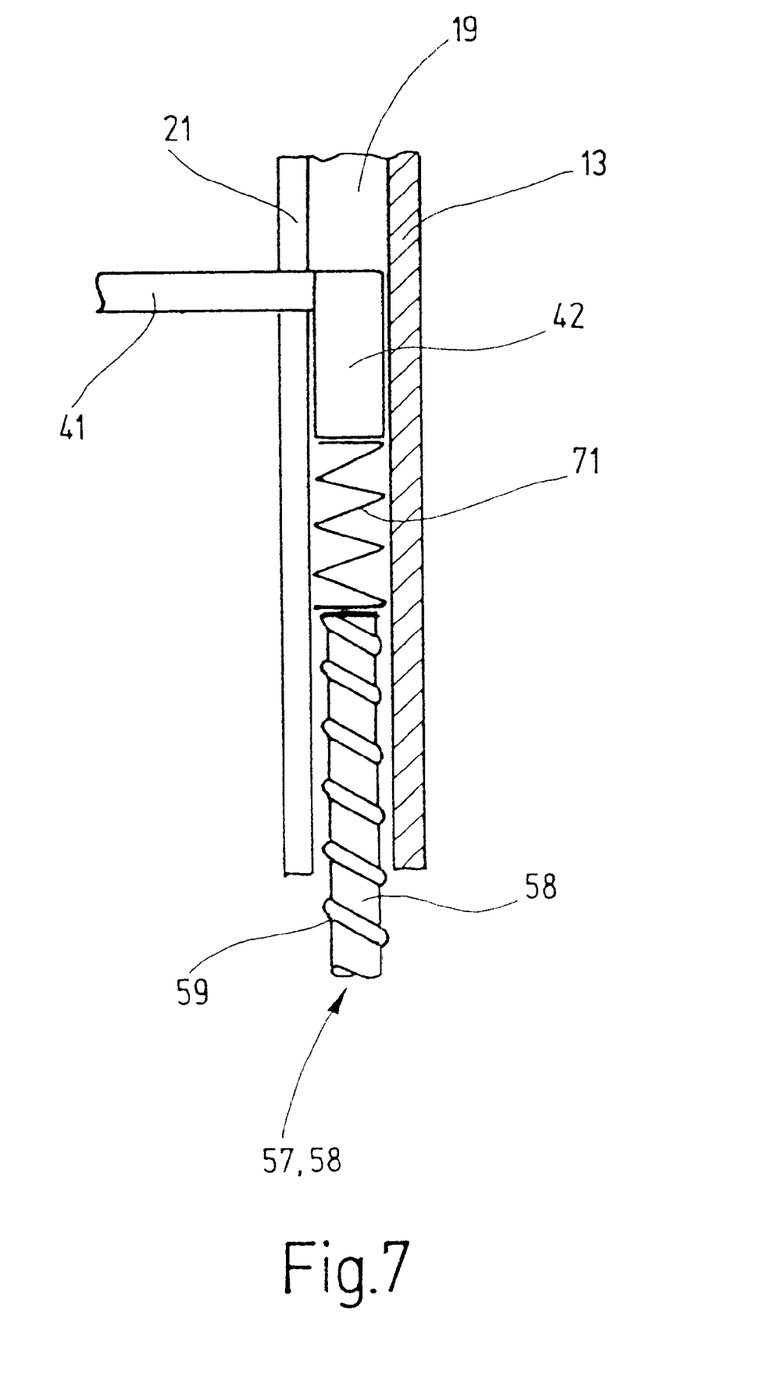

FIG. 7 shows an enlarged portion of one of the two guide rails 13, representing the cooperation between the respective thrust member 56, 57 and the respective guide member 38, or 39. A helical compression spring 71 is seated between the blunt end of the thrust member 56, 57 and the corresponding blunt end of the leg 42, angled off in an L-shape. Such an arrangement has been made for both sides of the windup window shade 12.

If the two effective ends of the thrust members 56 and 57 are at different distances from the respective guide elements 38, 39, this difference is compensated with the aid of the helical compression springs 71. At the point where the distance is less, the helical compression spring is compressed slightly more than on the opposite side. Although slightly different forces are generated by this, at the given height difference they do not have as great a value than if the helical compression springs 71 were lacking.

The amount of the force difference is a function of the length of the helical compression spring 71 and the characteristic spring curve. Depending on the embodiment, it is necessary to experimentally determine a compromise between the length of the spring 71 and a still permissible difference force.

Small force differences cannot yet cause visible waves in the extended window shade web 35.

A windup window shade has a windup shaft and a window shade web fastened on it. The window shade web is provided with a traction rod, which is moved at both ends by means of drive members along the guide rails. A compensating device is provided to compensate assembly tolerances or shape tolerances, which assures that too great tensions extending parallel with the windup shaft do not occur in the window shade web, which would lead to obliquely extending waves in the extended window shade web.

What is claimed is:

1. A windup window shade (12) for regulating the entry of light through a rear window into the interior of a motor vehicle, having at least one windup shaft (23), which is rotatably seated, having at least one window shade web (35), which is fastened along one edge to the windup shaft (23), whose edge which is parallel with the one edge is connected with an associated traction rod (37), and which has lateral longitudinal edges, wherein, in the course of the extension of the window shade web (35), the traction rod (37) has a nominal position with respect to the windup shaft (23) which position is a function of the position of the window shade web (35), and in which no transverse tensions occur, having at least one pair of guide means (13), each of which extends laterally beside the extended window shade web (35), and each of which contains at least a guide groove (19), in which the ends of the traction rod (37) are guided, having a drive mechanism (45), which has a first and a second thrust member (56, 57) arranged such that an effective end of the first thrust member (56) acts together with the one end of the traction rod (37), and the effective end of the second thrust member (57) acts together with the other end of the traction rod (37), and having a compensating device (22, 66, 71), which is equipped to at least reduce a displacement of the traction rod (37) by the thrust members (56, 57) out of the nominal position.

2. The window windup shade in accordance with claim 1, wherein the compensating device (22, 66, 71) prevents the displacement of tie traction rod (37) out of the nominal position when the effective end of the first thrust member (56) is at a different effective distance from the windup shaft (23) than the effective end of the second thrust member (57).

3. The window windup shade in accordance with claim 1, wherein the guide means (13) form a pair of guide grooves (19) which extend along the sides of the extended window shade web (35) and are used for guiding the traction rod (37).

4. The window windup shade in accordance with claim 3, wherein the guide grooves (19) are undercut guide grooves.

5. The window windup shade in accordance with claim 1, wherein a spring drive (34) is assigned to the windup shaft (23) and biases the windup shaft (23) in the windup direction.

6. The window windup shade in accordance with claim 1, wherein the window shade web (35) consists of a woven material or a perforated foil.

7. The window windup shade in accordance with claim 1, wherein the traction rod (37) is adjustable in length such that it is capable of following a changing distance between the guide grooves (19).

8. The window windup shade in accordance with claim 1, wherein the drive mechanism (45) comprises a gear motor (46) for driving the two thrust members (56, 57).

9. The window windup shade in accordance with claim 1, wherein the thrust members (56, 57) are flexible linearly-shaped thrust members, which are guided, secure from kinking, between the gear motor (46) and the respective guide groove (19).

10. The window windup shade in accordance with claim 1, wherein the thrust members (56, 57) are approximately cylindrical structures, which are provided with teeth (59) on the exterior, which extend at a constant pitch.

11. The window windup shade in accordance with claim 10, wherein the teeth (59) are formed by a rib, which extends helically on the exterior.

12. The window windup shade in accordance with claim 8, wherein the thrust members (56, 57) act interlockingly together with the gear motor (46).

13. The window windup shade in accordance with claim 1, wherein the compensating device (22, 66, 71) is designed such that the windup shaft (23) is limitedly pivotable with respect to an axis extending at right angles with respect to the longitudinal axis of the windup shaft (23).

14. The window windup shade in accordance with claim 13, wherein a seating hoop (22) is a part of the compensating device (22, 66, 71), in which an end of the at least one windup shaft (23) is seated, and which itself is pivotably seated with respect to an axis of the vehicle, in a bracket (29) fixed in place on the vehicle, wherein the axis extends at right angles to the axis of rotation of the windup shaft (23).

15. The window windup shade in accordance with claim 14, wherein the seating hoop (22) is elastically biased in a centered position by means of spring means (31, 32).

16. The window windup shade in accordance with claim 13, wherein at least one windup shaft bearing (62) is part of the compensating device (22, 66, 71), which allows only one end of the windup shaft (23) a movement only parallel in respect to the plane defined by the extended window shade web (35).

17. The window windup shade in accordance with claim 1, wherein the compensating device (22, 66, 71) comprises at least one spring member (71), which is arranged between at least one of the thrust members (56, 57) and the traction rod (37).

* * * * *